United States Patent [19]  
Effinger et al.

[11] Patent Number: 4,516,085  
[45] Date of Patent: May 7, 1985

[54] MICROWAVE FREQUENCY SYNTHESIZER USING PLURAL SWITCHABLE LOW NOISE OSCILLATORS

[75] Inventors: David D. Effinger, La Habra; Richard Docter, Chino, both of Calif.

[73] Assignee: Hughes Aircraft Company, El Segundo, Calif.

[21] Appl. No.: 404,161

[22] Filed: Aug. 2, 1982

[51] Int. Cl.³ .................................... H03B 21/01
[52] U.S. Cl. ................................ 331/40; 331/42; 331/49; 331/53
[58] Field of Search .............. 331/37, 40, 42, 43, 331/46, 49, 53, 179

[56] References Cited

U.S. PATENT DOCUMENTS

| 2,494,345 | 1/1950 | Manke | 331/40 |
| 2,756,331 | 7/1956 | Foster et al. | 331/40 |
| 3,227,963 | 1/1966 | Dimmick | 331/16 X |
| 3,248,652 | 4/1966 | Kruse | 331/41 X |
| 3,296,549 | 1/1967 | Johnson | 331/40 |
| 3,588,731 | 6/1971 | Hoeffer | 331/2 |
| 3,696,306 | 10/1972 | Klein, Jr. | 331/2 |
| 4,206,421 | 6/1980 | Bernhard et al. | 331/42 X |
| 4,272,730 | 6/1981 | Digiovanni | 331/16 |

OTHER PUBLICATIONS

E. F. Scherer, Compact Multi-Frequency Stalo Sources, 176 Microwave Journal, vol. 19, No. 3, Mar. 1976, pp. 41–44.

A. J. Budreau, A. J. Slobodnik, P. H. Carr, *A Review of Saw-Based Direct Frequency Synthesizers,* 8099 IEEE Transactions on Microwave Theory and Techniques, vol. MTT-30, May 1982, No. 5, pp. 686–693.

*Primary Examiner*—Eugene R. LaRoche  
*Assistant Examiner*—Robert J. Pascal  
*Attorney, Agent, or Firm*—Thomas A. Runk; A. W. Karambelas

[57] ABSTRACT

Disclosed is a low noise microwave frequency synthesizer having a plurality of rapidly switchable output frequencies. Two banks of oscillators are selectively mixed to yield a range of output signals of low phase noise and low spurious noise. The first bank of oscillators comprises low noise, highly stable oscillators of a frequency range below the desired synthesized output signal. The second bank of oscillators comprises low noise, highly stable oscillators of a frequency range lower than the first bank. The signal from the second bank of oscillators is frequency multiplied to a desired frequency range by a low multiplication factor and then mixed with the signal from the first bank of oscillators. Multiplied phase noise is reduced by using a low multiplication factor. The upper sideband of the mixed signals is output as the synthesized output signal. Rapid switching between oscillators in both banks provides a frequency range of synthesized output signals which may be rapidly stepped through as desired.

17 Claims, 2 Drawing Figures

MICROWAVE FREQUENCY SYNTHESIZER USING PLURAL SWITCHABLE LOW NOISE OSCILLATORS

The Government has rights to this invention pursuant to Contract No. DAAK 40-79-C-0262 awarded by the Department of the Army.

BACKGROUND OF THE INVENTION

This invention relates to frequency synthesizers and, more particularly, to those in the microwave frequency range which are stable, have low noise and are rapidly switchable between specific frequencies.

Present radar detection equipment has become very sophisticated and has created for need for lower power/spectral profile radar transmissions in order to avoid detection. A method to attain a lower power/spectral profile is the use of high duty factor, low peak power waveforms. Although high duty factor radar waveforms have been extensively used in airborne and space applications, ground-based radars have traditionally used low duty factor, high peak power waveforms. A major reason for this in ground radar installations is that the requirement for short range ground clutter rejection imposes stringent stability requirements on the radar exciter.

A method which makes the radar system less visible to detection equipment is the use of frequency agility. Changing frequencies between successive radar beams would require detection equipment to perform instantaneous frequency measurement and complex signal sorting, especially if multiple radars are operating in the same vicinity. This presents a large burden to the detection equipment.

In order to produce a radar system which can function in a ground installation and use high duty factor, low peak power waveforms, a low noise frequency synthesizer in the radar exciter is required. To produce frequency agility, this frequency synthesizer must have multiple output frequencies which may be rapidly changed.

It is therefore a purpose of the invention to provide a frequency synthesizer having a lower power/spectral profile signal in order to be less visible to radar detection equipment.

It is also a purpose of the invention to provide an ultra low noise and highly stable frequency synthesizer.

It is also a purpose of the invention to provide a low noise microwave frequency synthesizer such that it can be operated in a high duty factor mode in a ground installation application.

It is also a purpose of the invention to provide an improved frequency synthesizer which can rapidly change output frequencies.

SUMMARY OF THE INVENTION

The above purposes and additional purposes are accomplished by the invention wherein two banks of signal generating devices are selectively mixed after frequency multiplication of one bank to produce desired synthesizer output frequencies.

The first bank of signal generators or oscillators is termed the master oscillator bank and includes a selected number of highly stable, low noise oscillators of a frequency range, typically near but lower than the desired synthesizer output frequency range. The second bank of signal generators or oscillators is termed the secondary oscillator bank and likewise includes a selected number of highly stable, low noise oscillators but they are of a lower frequency range than the master oscillator bank.

The respective frequency ranges of the master and secondary oscillator banks are chosen so that their mixing after frequency multiplication of the secondary bank, will result in the desired range of synthesizer output frequencies. For example, if a synthesizer output range of frequencies in the X-band is desired, the master oscillator bank could consist of X-band oscillators. A device which is highly stable, low noise, and can operate at X-band is a klystron device. The secondary oscillator bank could then consist of devices which are lower frequency than X-band, and after frequency multiplication and when selectively mixed with the master oscillator bank, will result in the desired synthesizer output frequencies in the X-band. A highly stable, low noise device is a crystal controlled oscillator. This device is desirable because it produces an extremely low noise signal. However it is of a relatively low frequency (in the very high frequency range) and when mixed with the X-band master oscillator bank, the synthesizer output signal frequency would be very close to the frequency of the master oscillator bank. Thus filtering of the master oscillator bank signal could be difficult and may impact the noise level of the synthesizer output signal. Multiplying the frequency of the crystal controlled device to the L-band would result in wider output frequency steps and still provide a signal of lower noise than any known L-band source. Since the frequency multiplier also multiplies the phase noise of its source, the frequency multiplication factor must be kept low. Thus in the invention, a low noise output signal of the secondary oscillator bank is frequency multiplied by a low multiplication factor so as to keep multiplied noise at a minimum and is mixed with a low noise output signal of the master oscillator bank to produce a low noise synthesizer output signal.

In order to obtain frequency agility, all oscillators in the master and secondary oscillator banks are continuously oscillating. When not selected, they are isolated by switches. When a particular output frequency is selected, the required individual oscillators in the master and secondary oscillator banks are mixed and the desired combination signal is extracted. This combination signal may be filtered and amplified as required.

Thus the invention provides a low noise, highly stable microwave frequency synthesizer which is capable of generating a range of rapidly switchable, discrete output signals.

The novel features which are believed to be characteristic of this invention, both as to its structure and method of operation, together with further purposes and advantages will be better understood from the following descriptions considered in connection with the accompanying drawings.

DETAILED DESCRIPTION OF THE INVENTION

Figure 1:
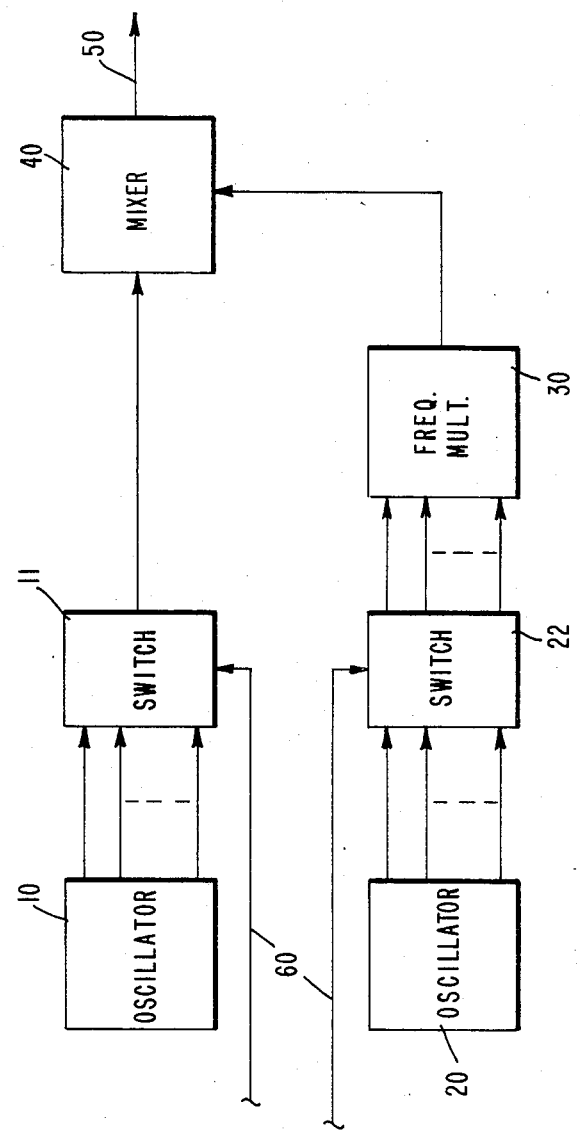
FIG. 1 is a block schematic diagram of a microwave frequency synthesizer in accordance with the invention.

Referring to FIG. 1, a schematic block diagram of a frequency synthesizer embodying the invention is presented. An oscillator in master oscillator bank 10 is selected and switched into mixing device 40 by switch 11. An oscillator in secondary oscillator bank 20 is selected and switched into frequency multiplier 30 by switch 22. Multiplier 30 multiplies the frequency by a selected multiplication factor and outputs this signal to mixing device 40. Mixing device 40 mixes the two signals and a combination signal 50 is produced. Command signals from a source not shown applied on control lines 60 cause switches 11 and 22 to select particular oscillators and isolate the remainder.

Master oscillator bank 10 contains a selected number of individual signal generating devices or oscillators. Since one of the concerns in the background of the invention is exciter stability, these oscillators have been chosen for maximum stability. Exciter stability can be broekn into two major components, spurious signals and phase noise. Analysis of phase noise contributions in exciter output signals reveals that the primary contributor below approximately 200 KHz from the carrier is the master oscillator. Therefore, a suitable low noise master oscillator must be chosen. The individual oscillators of the master oscillator bank 10 are devices chosen for their low phase noise content at frequencies from 1 KHz to 10 MHz removed from the carrier. For example, two sources satisfying this requirement in the X-band are the cavity stabilized Gunn oscillator and Klystron devices. These devices are fixed frequency, narrow band devices, and are well known in the art.

In order to obtain the rapid frequency switching capability which results in lower visibility to radar detection equipment, each oscillator of the master oscillator bank is continuously oscillating, and can be switched into and out of the mixing device 40 as required. High speed switch 11 accomplishes this. Switch 11 must have a switching speed at least as fast as the system speed required for its beam to beam frequency change. Switch 11 also must have high isolation to prevent passage of non-coherent spurious signals. In addition, it must prevent a favorable loading condition to the associated oscillator so as to not pull the oscillator off frequency due to load VSWR changes when switch 11 changes between on and off states. Various switching devices are available in the art which satisfy these requirements. A device usable in this embodiment is a PIN diode type single pole switch. This method of switching continuously runnng oscillators into and out of the mixing device 40 provides rapid frequency changes with associated lowest oscillator phase transients.

Secondary oscillator bank 20 contains a selected number of individual low noise signal generating devices or oscillators. These oscillators are likewise chosen for their stability and low noise characteristics. Crystal controlled oscillators are extremely stable and low noise and are well known in the art. A crystal controlled oscillator usable in this embodiment is a Colpitts oscillator. A description of the Colpitts oscillator can be found in V. Manassewitsch, *Frequency Synthesizers*, Wiley-Interscience Publications, 1976, pgs. 370–373. In order to obtain the rapid frequency switching capability, these oscillators are continuously oscillating as are the oscillators in the master oscillator bank and are switched into or out of mixing device 40 by way of switch 22. Switch 22 must have similar characteristics as identified previously for switch 11.

The number of oscillators chosen for the master and the secondary oscillator banks depends upon the number of different synthesizer output frequencies desired. For example, there may be only one oscillator in the master oscillator bank and a plurality of oscillators in the secondary oscillator bank or vice versa. Or in other cases, there may be a large number of oscillators in both of these banks. In the invention, the oscillators in the secondary oscillator bank are of a lower frequency than the oscillators in the master oscillator bank in order to obtain frequency steps.

The secondary oscillator bank signal switched into frequency multiplier 30 is frequency multiplied by a selected factor. Frequency multipliers are well known in the art and are readily available. Frequency multipliers of the diode-ring type or mixer type are usable in this embodiment. The frequency multiplier 30 is chosen for minimum device noise contribution. However, in addition to device noise it is well known that a frequency multiplier also multiplies the phase noise of its source, in this case the selected oscillator in the secondary oscillator bank. Frequency multiplier 30 will multiply the phase noise of the oscillator by a factor of 20 log N, where N is the multiplication ratio of factor. This adds approximately 6 dB of noise per each frequency doubling. Analysis of exciter output signals reveals that at frequencies exceeding approximately 200 KHz from the carrier, this multiplied phase noise can become a significant contributor to exciter instability. Therefore, the frequency multiplication factor is chosen to be as low a factor as is practical. The factor is chosen to be as low as practical to keep multiplied phase noise contributions of the secondary oscillator bank from becoming a significant contributor to the overall output phase noise of the synthesizer. As was previously discussed, phase noise in frequencies less than approximately 200 KHz from the carrier is primarily contributed by the master oscillator bank. Phase noise in frequencies exceeding approximately 200 KHz from the carrier is primarily contributed by the multiplied secondary oscillator bank. Therefore, the invention has minimized both of these phase noise contributions.

Mixing device 40 then mixes the two signals and outputs signals including sum and difference signals. A type of mixer usable in this embodiment is a double-balanced mixer. Since one of the concerns in the background of the invention is to generate a synthesizer output signal with the lowest possible phase noise content, the sum signal is used as the synthesizer output signal. Thus it can be seen that in the invention a balance is achieved. If the secondary oscillator bank output signal is not frequency multiplied enough, the sum signal may be too close in frequency to the master oscillator bank output signal frequency and filtering out of the master oscillator bank output signal may be difficult thereby increasing synthesizer noise. If the secondary oscillator bank output signal is frequency multiplied too much, multiplied phase noise of the secondary oscillator bank oscillator will become too large and will affect synthesizer output signal noise.

Figure 2:
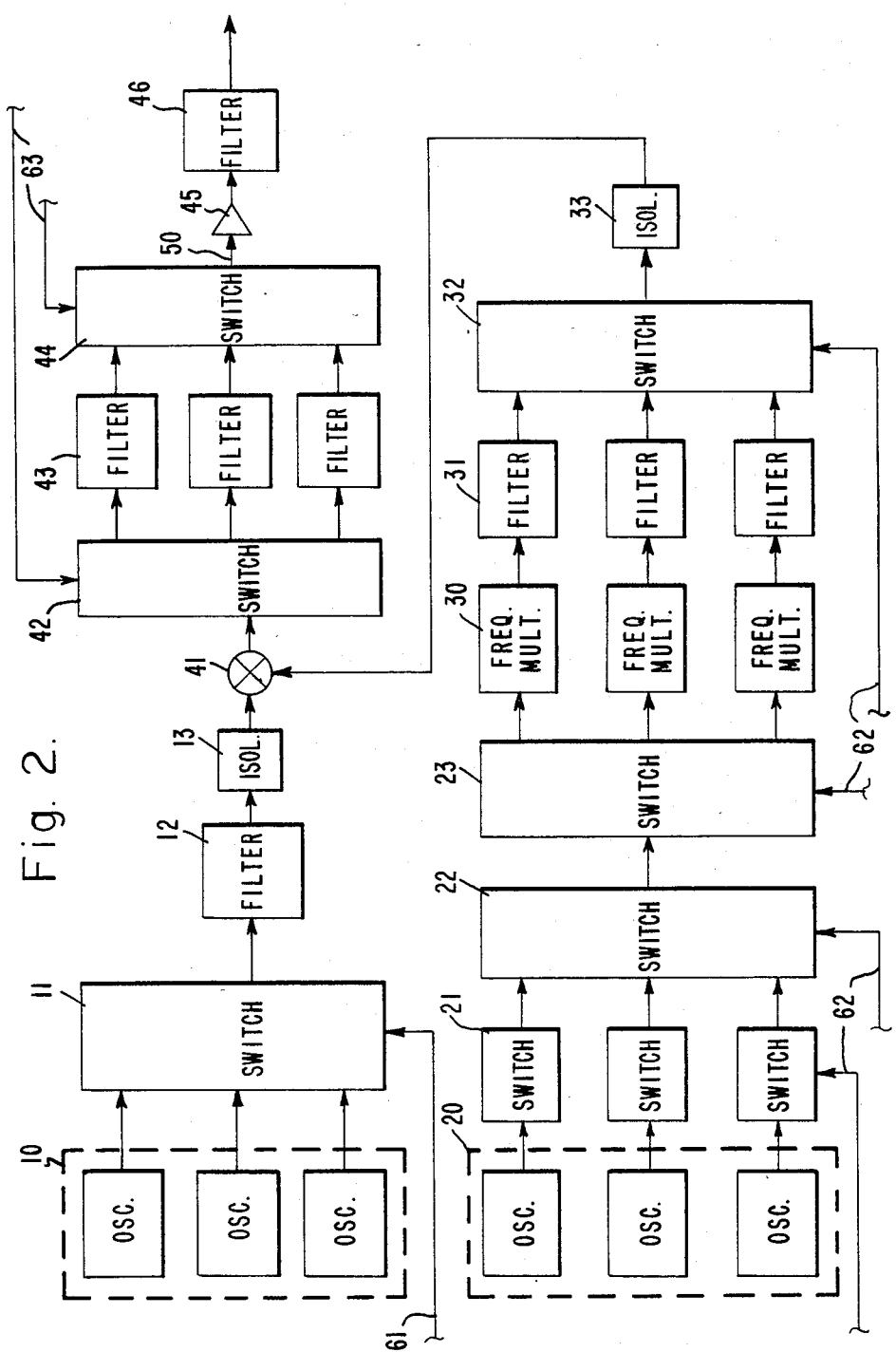
FIG. 2 is a more detailed block schematic diagram of a microwave frequency synthesizer in accordance with the invention.

FIG. 2 presents a more detailed diagram of a frequency synthesizer in accordance with the invention. There are three oscillators in the master oscillator bank 10 which are coupled to a high speed switch 11. This switch 11 gates a selected master oscillator bank oscillator to filter means 12. Since all master oscillator bank oscillators are continuously oscillating, switch 11 must provide on/off isolation to reject all master oscillator bank oscillators except the one selected in order to prevent non-coherent spurious output signals. Switch 11 must also present a favorable load to all the master oscillator bank oscillators so as not to pull unselected oscillators off frequency during switch state changes. Each switching means should be designed to have minimal input load impedance change during state changes. Filter means 12 removes coherent spurious outputs. Isolator 13 provides, among other things impedance matching to mixer 41. A type of isolator usable in this embodiment is a ferrite isolator.

There are three oscillators in the secondary oscillator bank 20 which are crystal controlled in this embodiment. They are tuned to different frequencies and oscillate continuously. High speed isolation switches 21 and 22 select the desired crystal oscillator 20. Extremely high isolation is required to prevent the unused but continuously operating oscillators 20 from bleeding through and adding non-coherent spurious signals.

The selected crystal oscillator 20 signal is then frequency multiplied by a selected multiplication factor by multiplier 30 through switch 23. That signal is then filtered by bandpass filter 31. Where there is a large number of oscillators in the secondary oscillator bank or these oscillators have a wide frequency spacing, more than one frequency multiplier 30 and succeeding filter means 31 may be required. This is because the percentage bandwidth in the frequency multiplier 30 and filter means 31 becomes too large to effectively filter spurious and harmonic signals. Switch 32 provides further isolation of unused multipliers 30 from the output signal. Isolator 33 provides among other things impedance matching to mixer 41.

Mixer 41 converts the two input signals into a combination signal which is the sum of the two. Switch 42 switches in filter bank 43 and permits the passage of this sum signal, and also isolates undesirable mixer output signals. A low frequency multiplication factor makes filter bank 43 desirable in order to filter out the signal from the selected oscillator of master oscillator bank 10. Switch 44 provides further isolation to the output signal 50 from unselected filters 43. At this point, output signal 50 may be amplified 45, filtered again 46 or otherwise processed, for example, to reduce noise contribution and to equalize frequency-to-frequency signal levels. Command signals from a source not shown applied on control lines 61, 62 and 63 cause their associated switches to either select or isolate particular oscillators and filters as is required to obtain the desired synthesizer output frequency.

As can be seen, there are 9 available frequencies in FIG. 2: MO1+XO1, MO1+XO2, MO1+XO3, MO2+XO1, MO2+XO2, MO2+XO3, MO3+XO1, MO3+XO2, and MO3+XO3, where MO1 through 3 are the three oscillators in the master oscillator bank and XO1 through 3 are the three oscillators in the secondary oscillator bank.

A low noise X-band synthesizer in accordance with the invention was built and tested. It utilized four oscillators in the master oscillator bank, twenty four oscillators in the secondary oscillator bank and a pair of frequency multipliers of multiplication factor eight. The oscillators in the master oscillator bank were dual cavity stabilized Gunn sources of frequencies approximately 800 MHz below the desired synthesizer output frequencies. The oscillators in the secondary oscillator bank were crystal controlled oscillators in the VHF range and when frequency multiplied up by eight, were in the L-band range. Dual cavity stabilized Gunn sources were utilized as oscillators in the master oscillator bank because they produce a signal with an extremely low phase noise of any source available in the frequency range. Likewise, crystal controlled oscillators were used in the secondary oscillator bank because even when frequency multiplied by a factor of eight, the phase noise is still the lowest of any known L-band source available.

Switch 11 was an SP4T RF switch with 120 dB on/off isolation. Switch 21 had on/off isolation of 134 dB with a switching speed of less than 200 ns. Switch 22 was added to increase isolation. Spurious signal and switching speed tests were performed on the exciter output. To obtain the exciter goal of −120 dBc for spurious signal levels, an on/off switch isolation of 138 dB was required in the secondary oscillator bank because of the multiplication factor of 8 applied to its output frequencies. Measured worst case isolation was 134 dB, with most channels in the 138 to 140 dB region. Measured frequency-to-frequency switching speed was less than 200 ns, easily exceeding the goal of 20 microseconds. Requirements for the master oscillator bank relate directly to the −120 dBc spurious signal specification. On/off isolation between frequencies was in excess of 100 dB which, when coupled with a very modest amount of band-pass filtering, easily exceeded a −120 dBc spurious requirement. Switching speed measured to be 100 ns.

Thus an improved low noise microwave frequency synthesizer has been disclosed. Due to the stability, low noise and frequency agility of the disclosed frequency synthesizer, it is particularly useful in a high duty factor, low peak power radar system.

It is to be understood that the above-described embodiment is merely illustrative of one of the embodiments which represent applications of the principles of the present invention. Clearly, numerous and varied other arrangements may readily be devised by those skilled in the art without departing from the spirit and scope of the invention.

What is claimed is:

1. A microwave frequency synthesizer responsive to electrical control signals for providing a selected one of a plurality of low phase noise, synthesized microwave signals, comprising:

a free running, incoherent microwave frequency oscillator which produces a low phase noise signal of a substantially fixed frequency in the microwave frequency range;

a plurality of crystal controlled oscillators for providing low phase noise output signals having frequencies such that eight times the value of any one of the frequencies is in a lower frequency band than the frequency of the microwave oscillator signal;

first switch means responsive to the electrical control signals for electrically selecting one of the plurality of the signals provided by the plurality of crystal controlled oscillators while isolating the remainder;

a frequency multiplier for producing a signal whose frequency is a multiple of the frequency of the selected crystal controlled oscillator signal by receiving the selected crystal controlled oscillator signal and multiplying the frequency thereof by a factor no greater than eight and no less than two; and a mixer for processing the signal produced by the microwave frequency oscillator with the frequency multiplied signal and producing a synthesized signal having a frequency equal to the sum of the frequencies of the two processed signals.

2. The frequency synthesizer of claim 1 wherein said microwave frequency oscillator comprises:
a plurality of free running, incoherent microwave frequency oscillators, each of which produces a low noise signal of a substantially fixed frequency in the microwave frequency range; and
second switch means responsive to the electrical control signals for electrically selecting one of the plurality of the signals provided by the plurality of microwave frequency oscillators while isolating the remainder.

3. The frequency synthesizer of claim 1 further comprising a filter means coupled to said mixer and which has a pass frequency of the synthesized microwave signals.

4. The frequency synthesizer of claim 2 wherein each of the microwave frequency oscillators is cavity stabilized.

5. The frequency synthesizer of claim 2 wherein each of the microwave frequency oscillators is selected from the group consisting of: a Gunn oscillator and a Klystron oscillator.

6. The frequency synthesizer of claim 5 wherein each of the microwave frequency oscillators provides a signal in the X-band frequency range and the signals produced by the crystal controlled oscillators are in the VHF frequency range.

7. The frequency synthesizer of claim 6 wherein the frequency multiplication factor is approximately eight.

8. The frequency synthesizer of claim 4 wherein the microwave frequency oscillator comprises a dual cavity stabilized Gunn oscillator which provides a signal in the X-band frequency range and wherein the signals provided by the crystal controlled oscillators are in the VHF frequency range, and wherein the frequency multiplication factor is approximately eight.

9. A microwave frequency synthesizer responsive to electrical control signals for providing a selected one of a plurality of low phase noise, synthesized microwave signals, comprising:
a first plurality of free running, incoherent oscillators each of which produces a low phase noise signal having a substantially fixed frequency in the X-band frequency range;
first switch means responsive to the electrical control signals for electrically selecting one of the plurality of the signals provided by the plurality of microwave oscillators while isolating the remainder;
a plurality of crystal contolled oscillators for providing low phase noise output signals having frequencies in the VHF band frequency range;
second switch means responsive to the electrical control signals for electrically selecting one of the plurality of the signals provided by the plurality of crystal controlled oscillators while isolating the remainder;
a frequency multiplier for producing a signal whose frequency is a multiple of the frequency of the selected crystal controlled oscillator signal by receiving the selected crystal controlled oscillator signal and multiplying the frequency thereof by a factor no greater than eight and no less than two; and
a mixer for processing the signal provided by the first switch means with the frequency multiplied signal and producing a synthesized signal having a frequency equal to the sum of the frequencies of the two processed signals.

10. The frequency synthesizer of claim 9 wherein each of the microwave frequency oscillators is cavity stabilized.

11. The frequency synthesizer of claim 10 wherein each microwave frequency oscillator comprises a dual cavity stabilized Gunn oscillator which provides a signal in the X-band frequency range and wherein the signals provided by the crystal controlled oscillators are in the VHF frequency range.

12. The frequency synthesizer of claim 11 wherein said frequency multiplying means has a frequency multiplication factor of eight.

13. The frequency synthesizer of claim 9 wherein each of the microwave frequency oscillators is selected from the group consisting of: a Gunn oscillator and a Klystron oscillator.

14. The frequency synthesizer of claim 13 wherein the frequency multiplication factor is approximately eight.

15. In a microwave frequency synthesizer, the method of generating a low phase noise microwave signal of a desired frequency in response to electrical control signals, comprising the steps of:
generating a plurality of low phase noise microwave signals by use of a plurality of free running, incoherent microwave frequency oscillators, each of which produces a low phase noise signal of a substantially fixed frequency in the microwave frequency range;
electrically selecting one of the plurality of the signals generated by the plurality of microwave frequency oscillators while isolating the remainder, in response to the electrical control signals;
generating a plurality of signals by use of a plurality of crystal controlled oscillators each of which produces a low phase noise signal of a substantially fixed frequency;
electrically selecting one of the plurality of the signals generated by the plurality of crystal controlled oscillators while isolating the remainder in response to the electrical control signals;
frequency multiplying the frequency of said selected crystal controlled oscillator signal by a multiplication factor no greater than eight and no less than two; and
mixing said selected microwave signal with said frequency multiplied signal and producing the synthesized signal having a frequency equal to the sum of the frequencies of the two mixed signals.

16. The method of claim 15 wherein said first signal is of an X-band frequency.

17. The method of claim 15 or claim 16 wherein said second signal is of a very high frequency (VHF) band frequency.

* * * * *